(12) United States Patent
Osanai et al.

(10) Patent No.: US 9,729,060 B2
(45) Date of Patent: Aug. 8, 2017

(54) POWER CONVERSION APPARATUS HAVING DC-DC CONVERTERS WITH DIFFERENT GATE RESISTANCES

(71) Applicant: TOYOTA JIDOSHA KABUSHIKI KAISHA, Toyota-shi, Aichi-ken (JP)

(72) Inventors: Yosuke Osanai, Toyota (JP); Asahi Ogata, Toyota (JP)

(73) Assignee: TOYOTA JIDOSHA KABUSHIKI KAISHA, Toyota (JP)

(\*) Notice: Subject to any disclaimer, the term of this patent is extended or adjusted under 35 U.S.C. 154(b) by 0 days.

(21) Appl. No.: 15/264,376

(22) Filed: Sep. 13, 2016

(65) Prior Publication Data

US 2017/0110965 A1   Apr. 20, 2017

(30) Foreign Application Priority Data

Oct. 20, 2015   (JP) ................... 2015-206341

(51) Int. Cl.
*H02M 3/158* (2006.01)
*H03K 17/08* (2006.01)
*H02M 1/084* (2006.01)

(52) U.S. Cl.
CPC ....... *H02M 3/1584* (2013.01); *H02M 3/1588* (2013.01); *H03K 17/08* (2013.01); *H02M 1/084* (2013.01)

(58) Field of Classification Search
CPC ........................................ H02M 3/158–3/1588
See application file for complete search history.

(56) References Cited

U.S. PATENT DOCUMENTS

| | | | | |
|---|---|---|---|---|
| 6,563,272 B1* | 5/2003 | Dufort | ................. | G09G 3/2965 315/169.3 |
| 7,205,821 B2* | 4/2007 | Rutter | ..................... | H02M 1/38 327/108 |
| 8,169,198 B2* | 5/2012 | Lin | ........................ | H02M 3/158 323/222 |
| 8,933,679 B2* | 1/2015 | Zhak | ........................ | G05F 3/08 323/222 |
| 9,246,389 B2* | 1/2016 | Ryoo | .................... | H02M 3/285 |
| 9,379,628 B2* | 6/2016 | Zambetti | .......... | H02M 3/33546 |
| 9,614,372 B2* | 4/2017 | Zhou | ........................ | H02J 1/02 |
| 2009/0230899 A1* | 9/2009 | Arimura | ............. | H02M 3/1582 318/400.01 |
| 2015/0003133 A1 | 1/2015 | Ogawa et al. | | |

FOREIGN PATENT DOCUMENTS

| | | |
|---|---|---|
| JP | 2013-162590 A | 8/2013 |
| JP | 2013-223265 A | 10/2013 |
| JP | 2014-155359 A | 8/2014 |

\* cited by examiner

*Primary Examiner* — Harry Behm
*Assistant Examiner* — Peter Novak
(74) *Attorney, Agent, or Firm* — Oliff PLC

(57) ABSTRACT

A power conversion apparatus is provided with a plurality of DC-DC converters. Each of the DC-DC converters includes at least one gate resistor and a gate driver. The gate driver is configured to selectively connect a gate electrode of a switching element, via the gate resistor, with one of an on-potential point and an off-potential point. A gate resistor of a second DC-DC converter has a higher resistance than a gate resistor of a first DC-DC converter.

6 Claims, 11 Drawing Sheets

POWER CONVERSION APPARATUS HAVING DC-DC CONVERTERS WITH DIFFERENT GATE RESISTANCES

CROSS-REFERENCE TO RELATED APPLICATION

This application claims priority to Japanese Patent Application No. 2015-206341 filed on Oct. 20, 2015, the contents of which are hereby incorporated by reference into the present application.

TECHNICAL FIELD

The technique disclosed herein relates to a power conversion apparatus that includes a plurality of DC-DC converters connected in parallel.

DESCRIPTION OF RELATED ART

Japanese Patent Application Publication No. 2014-155359 (JP 2014-155359 A) describes a power conversion apparatus that includes a plurality of DC-DC converters connected in parallel. Each of the DC-DC converters includes an inductor, a diode, and a switching element. One end of the inductor is connected to a positive input port. An anode of the diode is connected to the other end of the inductor, and a cathode of the diode is connected to a positive output port. One end of the switching element is connected to the other end of the inductor, and another end of the switching element is connected to a negative input port and a negative output port. Each of the DC-DC converters boosts a DC current inputted from the positive input port and the negative input port by its switching element turning on and off at fast speed, and outputs the boosted current from the positive output port and the negative output port. As with this power conversion apparatus, since a plurality of DC-DC converters is connected in parallel, a large power conversion can be carried out while reducing the current flowing through each of the DC-DC converters.

In each of the DC-DC converters, a ringing is generated due to the switching of the switching element. For example, when the switching element is turned off, the ringing is generated in a voltage between the ends of the switching element. Further, when the switching element is turned on, the ringing is generated in the current flowing through the switching element. Here, in the power conversion apparatus that includes the plurality of DC-DC converters connected in parallel, when for example all of the switching elements are turned on or off at the same time, the ringing generated in the respective switching elements are superposed, which leads to a generation of a large ringing. With respect to this issue, in the power conversion apparatus described in JP 2014-155359 A, timings at which the switching elements are turned on are offset one another among the plurality of DC-DC converters. Due to this, phase differences are given to the ringing caused by the respective switching elements so that a mutual cancellation of their ringing can be obtained. As a result of this, reduction of the ringing is facilitated.

BRIEF SUMMARY

In the technique described in JP 2014-155359 A, the timings at which the switching elements are turned on are simply offset one another. Thus, the switching element that is turned on first (which will hereafter be referred to as a first switching element) and the switching element that is turned on thereafter with a delay (which will hereafter be referred to as a second switching element) generate the ringing of a same magnitude. Here, the ringing is vibration that is accompanied by attenuation. Thus, at the time when the second switching element is turned on, the ringing that had been generated by the first switching element already exhibits a certain amount of attenuation. Thus, if the ringing caused by the second switching element is generated at the same magnitude as the ringing caused by the first switching element (having a same initial amplitude), the amplitude of the ringing caused by the second switching element will always be greater than the amplitude of the ringing caused by the first switching element. In this case, no matter how the phase difference between these ringings is adjusted, there is a case where the ringing cannot be sufficiently reduced. Further, since the ringing caused by the second switching element will be converged with some delay from the ringing caused by the first switching element, thus there is also a problem that the ringing lasts long.

The present disclosure provides a technique for a power conversion apparatus that connects a plurality of DC-DC converters in parallel, which can effectively reduce ringing caused by switching of switching elements.

A power conversion apparatus disclosed herein comprises: a positive input port and a negative input port that are configured to be connected with a DC power source; a positive output port and a negative output port that are configured to be connected with an electric load; a capacitor connected between the positive output port and the negative output port; and a plurality of DC-DC converters connected in parallel with each other with respect to the positive input port, the negative input port, the positive output port, and the negative output port. Each of the plurality of DC-DC converters comprises an inductor, a high-side diode, and a low-side switching element. One end of the inductor is connected with the positive input port. An anode of the high-side diode is connected with another end of the inductor and a cathode of the high-side diode is connected with the positive output port. One end of the low-side switching element is connected with the other end of the inductor and another end of low-side switching element is connected with the negative input port and the negative output port. The low-side switching element comprises a gate electrode.

Each of the plurality of DC-DC converters further comprises at least one low-side gate resistor; and a low-side gate driver. The low-side gate driver is configured to connect, via the low-side gate resistor, the gate electrode of the low-side switching element selectively with one of an off-potential point and an on-potential point. Here, the low-side switching element turns off by its gate electrode being connected with the off-potential point, and turns on by its gate electrode being connected with the on-potential point. The low-side gate drivers of the plurality of DC-DC converters are each configured to operate in response to a first driving signal. The plurality of DC-DC converters includes a first DC-DC converter and a second DC-DC converter at least, and the low-side gate resistor of the second DC-DC converter has a higher resistance than the low-side gate resistor of the first DC-DC converter.

In general, a switching speed of a switching element becomes slower with a gate resistor having a higher resistance. Further, as the switching speed of a switching element becomes slower, an initial amplitude of a ringing caused by switching of the switching element becomes smaller. In regards to these points, in the aforementioned power conversion apparatus, the low-side gate resistor of the second DC-DC converter has a higher resistance than the low-side gate resistor of the first DC-DC converter. As a result, the low-side gate resistor of the second DC-DC converter is switched with some delay from the low-side gate resistor of the first DC-DC converter. Due to this, these two low-side switching elements are prevented from being switched on simultaneously, so two ringings caused by these two low-side switching elements can at least partially be cancelled out by each other. Further, the initial amplitude of the ringing caused by the low-side switching element of the second DC-DC converter becomes smaller than the initial amplitude of the ringing caused by the low-side switching element of the first DC-DC converter. Thus, the amplitudes at same time points can be matched or brought closer to each other between the two ringings that had been generated at different timings. Due to this, the two ringings can effectively be cancelled out by each other, and the ringings can be reduced. Further, by the initial amplitude of the ringing generated with the delay being reduced, a conversion can be achieved faster, and the ringings can be avoided from continuing for a long time.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved power conversion apparatuses, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

A power conversion apparatus 10 of an embodiment will be described with reference to the drawings. The power conversion apparatus 10 is an apparatus that converts electric power (especially voltage) between a DC power source 2 and an electric load 4. The power conversion apparatus 10 is configured to boost the power from the DC power source 2 and supply the same to the electric load 4. Further, the power conversion apparatus 10 is configured to reduce the power from the electric load 4 and supply the same to the DC power source 2 when the electric load 4 serves as a generator. Although this is merely an example, the power conversion apparatus 10 may be utilized in electric vehicles (including hybrid vehicles), and conversion of necessitated power (voltage) can be performed between a battery which corresponds to the DC power source 2 and an inverter and a motor, which correspond to the electric load 4. In this case, a rated voltage of the battery may for example be 200V, and a rated voltage of the inverter and the motor may for example be 600V.

Figure 1:
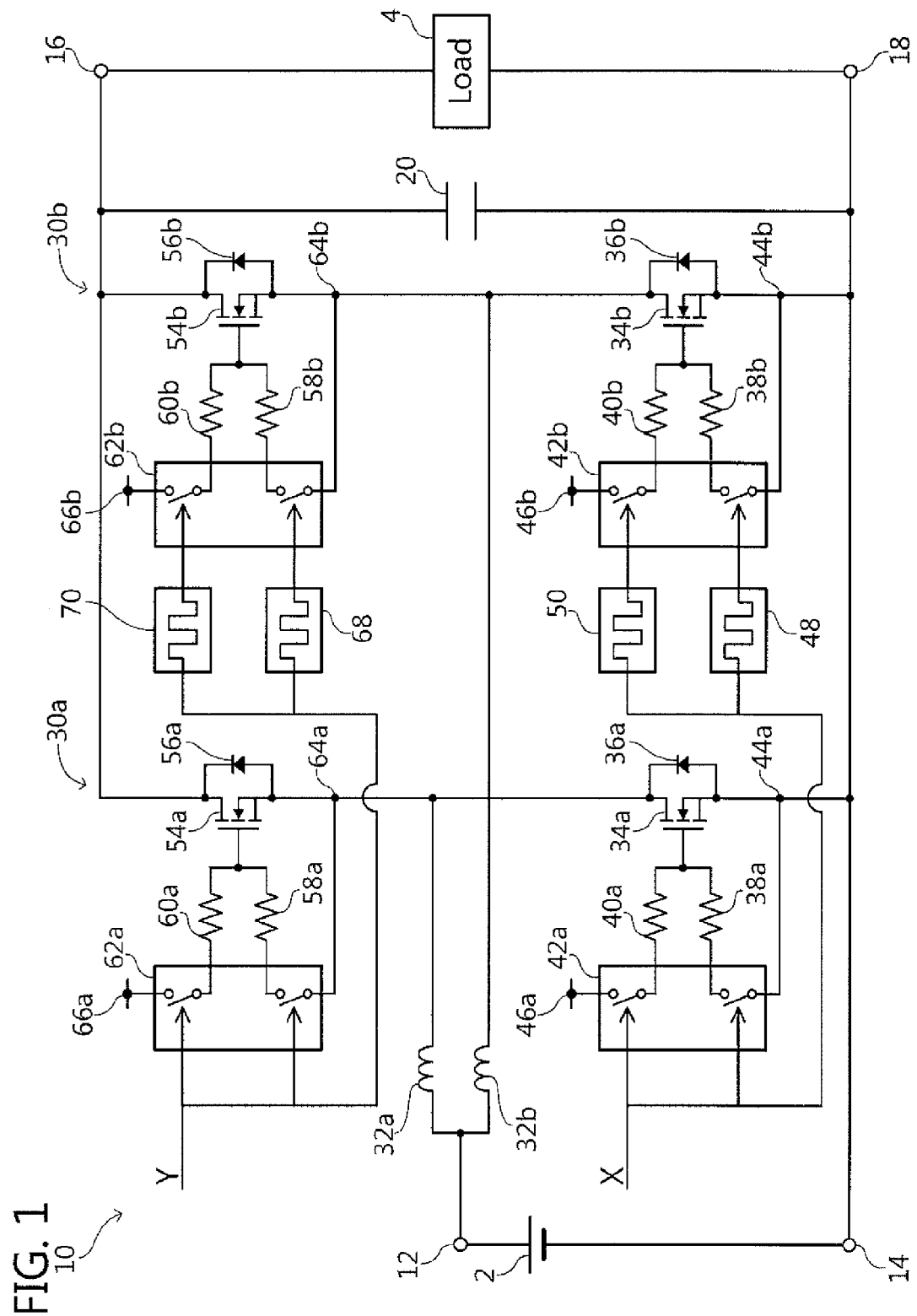
FIG. 1 schematically shows a configuration of a power conversion apparatus 10 of an embodiment.

As shown in FIG. 1, the power conversion apparatus 10 comprises a positive input port 12 and a negative input port 14 that are connected with the DC power source 2, and a positive output port 16 and a negative output port 18 that are connected with the electric load 4. The negative input port 14 and the negative output port 18 are connected with each other, and they both are maintained at a same potential (reference potential).

The power conversion apparatus 10 further comprises a capacitor 20 and a plurality of DC-DC converters 30a, 30b. The plurality of DC-DC converters 30a, 30b includes a first DC-DC converter 30a and a second DC-DC converter 30b. Notably, the plurality of DC-DC converters 30a, 30b may include three or more DC-DC converters.

The capacitor 20 is connected between the positive output port 16 and the negative output port 18, and suppresses a voltage fluctuation between the positive output port 16 and the negative output port 18. The plurality of DC-DC converters 30a, 30b is connected in parallel to each other with respect to the positive input port 12, the negative input port 14, the positive output port 16, and the negative output port 18. That is, the plurality of DC-DC converters 30a, 30b is connected in parallel with respect to the capacitor 20 as well. Hereinbelow, a "DC-DC converter" may simply be termed a "converter".

The converters 30a, 30b comprise inductors 32a, 32b, low-side switching elements 34a, 34b, low-side diodes 36a, 36b, high-side switching elements 54a, 54b, high-side diodes 56a, 56b, respectively. Each of the low-side switching elements 34a, 34b and the high-side switching elements 54a, 54b is a power semiconductor switching element having an insulated-type gate electrode, and may for example be a MOSFET (Metal-Oxide-Semiconductor Field-Effect Transistor) or an IGBT (Insulated Gate Bipolar Transistor). In the present embodiment, normally-off type MOSFETs having identical configurations are employed as the respective switching elements 34a, 34b, 54a, 54b.

In the respective converters 30a, 30b, one ends of the inductors 32a, 32b are connected with the positive input port 12. One ends (drain electrodes) of the low-side switching elements 34a, 34b are connected with another ends of the inductors 32a, 32b, and another ends (source electrodes) of the low-side switching elements 34a, 34b are connected with the negative input port 14 and the negative output port 18. Cathodes of the low-side diodes 36a, 36b are connected with the other ends of the inductors 32a, 32b, and anodes of the low-side diodes 36a, 36b are connected with the negative input port 14 and the negative output port 18. The low-side switching elements 34a, 34b are connected parallel to the low-side diodes 36a, 36b, respectively.

One ends (source electrodes) of the high-side switching elements 54a, 54b are connected with the other ends of the inductors 32a, 32b, and another ends (drain electrodes) of the high-side switching elements 54a, 54b are connected with the positive output port 16. Anodes of the high-side diodes 56a, 56b are connected with the other ends of the inductors 32a, 32b, and cathodes of the high-side diodes 56a, 56b are connected with the positive output port 16. The high-side switching elements 54a, 54b are connected parallel to the high-side diodes 56a, 56b, respectively.

The respective converters 30a, 30b further comprise pluralities of low-side gate resistors 38a, 38b, 40a, 40b, and low-side gate drivers 42a, 42b. The pluralities of low-side gate resistors 38a, 38b, 40a, 40b include first gate resistors 38a, 38b and second gate resistors 40a, 40b. The first gate resistors 38a, 38b are connected in parallel to 40a, 40b, respectively with respect to the gate electrodes of the low-side switching elements 34a, 34b. The first gate resistor 38b of the second converter 30b has a higher resistance than the first gate resistor 38a of the first converter 30a. Further, the second gate resistor 40b of the second converter 30b has a higher resistance than the second gate resistor 40a of the first converter 30a.

The low-side gate drivers 42a, 42b are circuits for controlling on and off of the low-side switching elements 34a, 34b. The low-side gate drivers 42a, 42b are configured to turn-off the low-side switching elements 34a, 34b by connecting the gate electrodes of the low-side switching elements 34a, 34b to off-potential points 44a, 44b. Further, the low-side gate drivers 42a, 42b are configured to turn-on the low-side switching elements 34a, 34b by connecting the gate electrodes of the low-side switching elements 34a, 34b to on-potential points 46a, 46b. Here, when the low-side gate drivers 42a, 42b turn-off the low-side switching elements 34a, 34b, the gate electrodes of the low-side switching elements 34a, 34b are connected with the off-potential points 44a, 44b via the first gate resistors 38a, 38b. On the other hand, when the low-side gate drivers 42a, 42b turn-on the low-side switching elements 34a, 34b, the gate electrodes of the low-side switching elements 34a, 34b are connected with the on-potential points 46a, 46b via the second gate resistors 40a, 40b.

The low-side gate drivers 42a, 42b of the respective converters 30a, 30b are configured to operate in response to a common first driving signal X. The first driving signal X is a pulse signal string supplied from a control device (not shown). The low-side gate drivers 42a, 42b are configured to connect the gate electrodes of the low-side switching elements 34a, 34b selectively either to the off-potential points 44a, 44b or to the on-potential points 46a, 46b according to the first driving signal X. Due to this, the low-side gate driver 42a, 42b can switch (between on and off) the low-side switching elements 34a, 34b at fast speed. Here, the aforementioned pulse signal string may for example be a PWM signal, and a ratio of a period during which the low-side switching elements 34a, 34b are turned on (i.e. duty ratio) is adjusted according to an amplitude of the pulse signal.

The second converter 30b further comprises a first delay circuit 48 and a second delay circuit 50. The first delay circuit 48 and the second delay circuit 50 are respectively configured to delay timings when the low-side gate driver 42b receives the first driving signal X. Here, a delay time by the first delay circuit 48 and a delay time by the second delay circuit 50 differ from each other. The first delay circuit 48 and the second delay circuit 50 are connected in parallel to each other with respect to the low-side gate driver 42b. Due to this, the low-side gate driver 42b of the second converter 30b can receive both the first driving signal X delayed by the first delay circuit 48 and the first driving signal X delayed by the second delay circuit 50. Further, the low-side gate driver 42b of the second converter 30b is configured to connect the gate electrode of the low-side switching element 34b to the off-potential point 44b according to the first driving signal X delayed by the first delay circuit 48, and is configured to turn off the low-side switching element 34b. Further, the low-side gate driver 42b of the second converter 30b is configured to connect the gate electrode of the low-side switching element 34b to the on-potential point 46b according to the first driving signal X delayed by the second delay circuit 50, and is configured to turn on the low-side switching element 34b.

Although details will be described later, the first delay circuit 48 and the second delay circuit 50 are provided to give suitable time differences between the first converter 30a and the second converter 30b to timings at which the low-side gate drivers 42a, 42b respectively receive the first driving signal X. Due to this, the first delay circuit 48 and the second delay circuit 50 may be provided in both of the first and the second converters 30a, 30b if needed, or alternatively they may be provided only in the first converter 30a.

The converters 30a, 30b respectively comprise pluralities of high-side gate resistors 58a, 58b, 60a, 60b, and high-side gate drivers 62a, 62b. The pluralities of high-side gate resistors 58a, 58b, 60a, 60b include third gate resistors 58a, 58b and fourth gate resistors 60a, 60b. The third gate resistors 58a, 58b are connected in parallel to the fourth gate resistors 60a, 60b, respectively, with respect to the gate electrodes of the high-side switching elements 54a, 54b. The third gate resistor 58b of the second converter 30b has a higher resistance than the third gate resistor 58a of the first converter 30a. Further, the fourth gate resistor 60b of the second converter 30b has a higher resistance than the fourth gate resistor 60a of the first converter 30a.

The high-side gate drivers 62a, 62b are circuits for turning the high-side switching elements 54a, 54b on and off. The high-side gate drivers 62a, 62b are configured to turn-off the high-side switching elements 54a, 54b by connecting the gate electrodes of the high-side switching elements 54a, 54b to off-potential points 64a, 64b, respectively. Further, the high-side gate drivers 62a, 62b are configured to turn-on the high-side switching elements 54a, 54b by connecting the gate electrodes of the high-side switching elements 54a, 54b to on-potential points 66a, 66b. Here, when the high-side gate drivers 62a, 62b turn-off the high-side switching elements 54a, 54b, the gate electrodes of the high-side switching elements 54a, 54b are connected to the off-potential points 64a, 64b via the third gate resistors 58a, 58b. On the other hand, when the high-side gate drivers 62a, 62b turn-on the high-side switching elements 54a, 54b, the gate electrodes of the high-side switching elements 54a, 54b are connected to the on-potential points 66a, 66b via the fourth gate resistors 60a, 60b.

The high-side gate drivers 62a, 62b of the respective converters 30a, 30b are configured to operate in response to a common second driving signal Y. The second driving signal Y is a pulse signal string supplied from the control device (not shown). The high-side gate drivers 62a, 62b are configured to connect the gate electrodes of the high-side switching elements 54a, 54b selectively either to the off-potential points 64a, 64b or to the on-potential points 66a, 66b according to the second driving signal Y. Due to this, the high-side gate drivers 62a, 62b can switch (between on and off) the high-side switching elements 54a, 54b at fast speed. Here, the aforementioned pulse signal string may for example be a PWM signal, and a ratio of a period during which the high-side switching elements 54a, 54b are turned on (i.e. duty ratio) is adjusted according to an amplitude of the pulse signal.

The second converter 30b further comprises a third delay circuit 68 and a fourth delay circuit 70. The third delay circuit 68 and the fourth delay circuit 70 are respectively configured to delay timings when the high-side gate driver 62b receives the second driving signal Y. Here, a delay time by the third delay circuit 68 and a delay time by the fourth delay circuit 70 differ from each other. The third delay circuit 68 and the fourth delay circuit 70 are connected in parallel to each other with respect to the high-side gate driver 62b. Due to this, the high-side gate driver 62b of the second converter 30b can receive both the second driving signal Y delayed by the third delay circuit 68 and the second driving signal Y delayed by the fourth delay circuit 70. Further, the high-side gate driver 62b of the second converter 30b is configured to connect the gate electrode of the high-side switching element 54b to the off-potential point 64b according to the second driving signal Y delayed by the third delay circuit 68, and is configured to connect the gate electrode of the high-side switching element 54b to the on-potential point 66b according to the second driving signal Y delayed by the fourth, delay circuit 70. Similar to the aforementioned first delay circuit 48 and second delay circuit 50, the third delay circuit 68 and the fourth delay circuit 70 may be provided in both of the first and the second converters 30; 30b if needed, or alternatively they may be provided only in the first converter 30a.

Next, an operation of the power conversion apparatus 10 will be described. As aforementioned, the power conversion apparatus 10 is capable of boosting the power from the DC power source 2 and supplying the same to the electric load 4. In this boosting operation, primarily the inductors 32a, 32b, the high-side diodes 56a, 56b, and the low-side switching elements 34a, 34b function. During the boosting operation, the first driving signal X being the pulse signal string is inputted to the low-side gate drivers 42a, 42b of the converters 30a, 30b. Due to this the low-side switching elements 34a, 34b are respectively switched at fast speed. On the other hand, the high-side switching elements 54a, 54b are kept turned off. In the first converter 30a, when the low-side switching element 34a is turned on, a current flows in a closed circuit connecting the DC power source 2, the inductor 32a, and the low-side switching element 34a, and energy is charged in the inductor 32a. Thereafter, when the low-side switching element 34a is turned off, the energy charged in the inductor 32a is discharged, and a current flows in a closed circuit connecting the DC power source 2, the inductor 32a, the high-side diode 56a, and the capacitor 20 (or the electric load 4). By the fast-speed switching being repeated by the low-side switching element 34a, the power from the DC power source 2 is boosted and supplied to the electric load 4. An operation in the second converter 30b is similar to the above, thus the description thereof will be omitted.

The power conversion apparatus 10 can also cause the supplied power from the electric load 4 to step down and supply the same to the DC power source 2. In this step-down operation, primarily the inductors 32a, 32b, the high-side switching elements 54a, 54b, and the low-side diodes 36a, 36b function. During the step-down operation, the second driving signal Y being the pulse signal string is inputted to the high-side gate drivers 62a, 62b of the converters 30a, 30b. Due to this, the high-side switching elements 54a, 54b are respectively switched at fast speed. On the other hand, the low-side switching elements 34a, 34b are kept turned off. In the first converter 30a, when the high-side switching element 54a is turned on, a current flows from the electric load 4 (or the capacitor 20) toward the inductor 32a, and energy is charged in the inductor 32a. Thereafter, when the high-side switching element 54a is turned off, the energy charged in the inductor 32a is discharged, and a current flows in a closed circuit connecting the DC power source 2, the inductor 32a, and the low-side diode 36a. By the fast-speed switching being repeated by the high-side switching element 54a, the power from the electric load 4 is brought down, and is supplied to the DC power source 2. An operation in the second converter 30b is similar to the above, thus the description thereof will be omitted.

Figure 2:
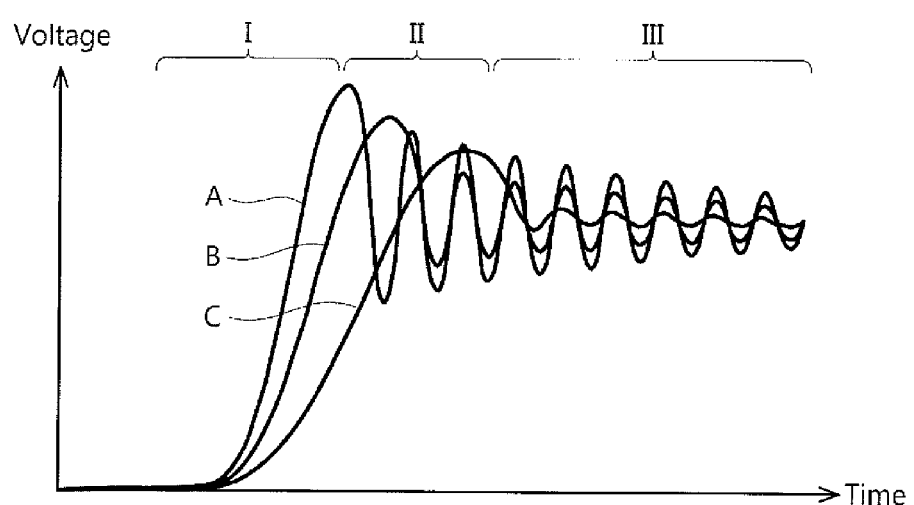
FIG. 2 is a graph showing voltages between both ends of low-side switching elements 34a, 34b immediately after their turn-off, where a curve A shows a case where first gate resistors 38a, 38b have a low resistance, a curve B shows a case where the first gate resistors 38a, 38b have a medium resistance, and a curve C shows a case where the first gate resistors 38a, 38b have a higher resistance.

As described above, in the boosting operation of the power conversion apparatus 10, the low-side switching elements 34a, 34b are switched at fast speed, so a ringing is generated due to the switching of the low-side switching elements 34a, 34b. Firstly, the ringing caused by turning off the low-side switching element 34a will be described by taking the first converter 30a as an example. As shown in FIG. 2, when the low-side switching element 34a is turned off, the voltage between both ends of the low-side switching element 34a (drain-source voltage) rises rapidly towards a target value, and thereafter fluctuates while attenuating toward the target value. This fluctuation having the attenuating nature is the ringing. The ringing can be a cause of energy losses and electromagnetic noises, thus is desirably reduced.

As shown in FIG. 2, a waveform of the ringing caused by the turn-off of the low-side switching element 34a changes according to a resistance value of the first gate resistor 38a used in the turn-off of the low-side switching element 34a. As can be seen in a phase I in FIG. 2, a changing rate of the voltage between both ends of the low-side switching element 34a becomes smaller as the resistance value of the first gate resistor 38a becomes higher, as a result of which the switching speed of the low-side switching element 34a is slowed down. As a result, as can be seen in a phase II in FIG. 2, an initial amplitude of the ringing (maximum amplitude that is exhibited at the beginning of the ringing) becomes smaller as the resistance value of the first gate resistor 38a becomes higher. On the other hand, as can be seen in a phase III in FIG. 2, even if the resistance value of the first gate resistor 38a is changed, an attenuation rate and cycles of the ringing do not change. This is because electric properties of a circuit in which the current fluctuates due to the ringing (that is, resistance components, capacitance components, and inductance components that the respective elements and wirings (including the capacitor 20, the high-side diode 56a, and the low-side switching element 34a) have) do not change regardless of the resistance value of the first gate resistor 38a.

Similarly in the second converter 30b, the ringing is generated in its voltage between both ends of the low-side switching element 34b (drain-source voltage) due to the turn-off of the low-side switching element 34b. Further, as shown in FIG. 2, a waveform of the ringing caused by the turn-off of the low-side switching element 34b changes according to a resistance value of the first gate resistor 38b used in the turn-off of the low-side switching element 34b.

In regards to the ringings generated by the turn-off of the aforementioned low-side switching elements 34a, 34b, in the power conversion apparatus 10 of the present embodiment, the first gate resistor 38b of the second converter 30b has a higher resistance than the first gate resistor 38a of the first converter 30a. Due to this, the low-side switching element 34b of the second converter 30b (hereinbelow referred to as a second low-side switching element 34b) is turned off with delay with respect to the low-side switching element 34a of the first converter 30a (hereinbelow referred to as a first low-side switching element 34a).

Figure 3:
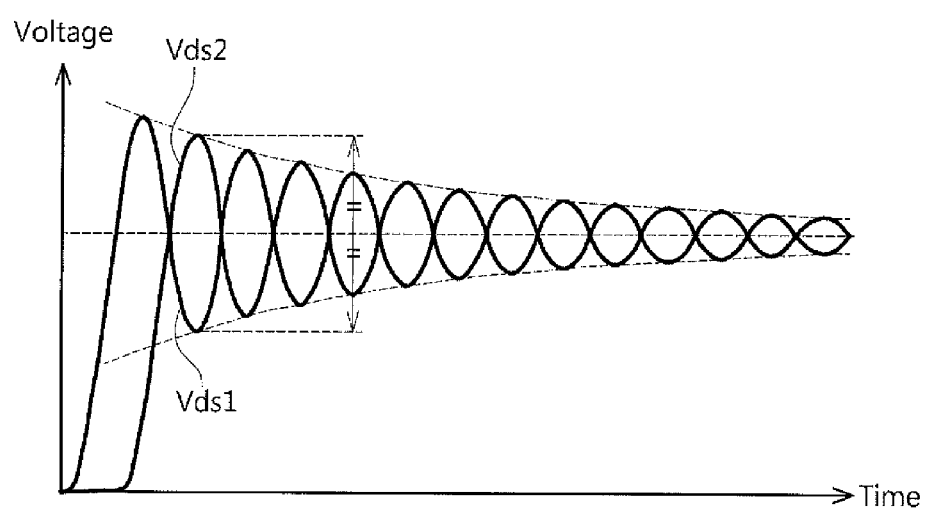
FIG. 3 is a graph exemplifying a voltage Vds1 between both ends of the low-side switching element 34a of a first DC-DC converter 30a immediately after its turn-off and a voltage Vds2 between both ends of the low-side switching element 34b of a second DC-DC converter 30b immediately after its turn-off, where a ringing of the voltage Vds1 and a ringing of the voltage Vds2 have a phase difference that is ½ of a ringing cycle, and their envelope curves match each other.

As a result, as shown in FIG. 3, a phase difference is generated between the ringing generated by the turn-off of the first low-side switching element 34a and the ringing generated by the turn-off of the second low-side switching element 34b. Here, Vds1 in FIG. 3 shows the voltage between both ends of the first low-side switching element 34a, and Vds2 shows the voltage between both ends of the second low-side switching element 34b. Due to this, the two ringings generated by the turn-off of two low-side switching elements 34a, 34b can be partially or completely cancelled according to the phase difference of the two ringings. Here, the phase difference of the two ringings can be adjusted according to the resistance values of the two first gate resistors 38a, 38b. For example, the phase difference thereof may be adjusted so that the ringing generated by the turn-off of the second low-side switching element 34b takes its maximum value at a timing when the ringing generated by the turn-off of the first low-side switching element 34a takes its minimum value. That is, the phase difference of the two ringings is set to ½ of the ringing cycle. In this case, the two ringings can most effectively be cancelled.

Moreover, since the first gate resistor 38b of the second converter 30b has a higher resistance than the first gate resistor 38a of the first converter 30a, the initial amplitude of the ringing generated by the turn-off of the second low-side switching element 34b becomes smaller than the initial amplitude of the ringing generated by the turn-off of the first low-side switching element 34a. That is, the initial amplitude of the ringing generated with delay becomes small with respect to the initial amplitude of the ringing that was precedingly generated. As mentioned above, the ringing is a fluctuation accompanied by attenuation. Thus, at the time when the second low-side switching element 34b is turned off with delay, the ringing that had precedingly been generated already exhibits a certain amount of attenuation. Thus, if the initial amplitude of the ringing generated with delay is made small with respect to the initial amplitude of the precedingly-generated ringing, the amplitudes of the two ringings at a same time point can be made to match or come close to each other. Due to this, the two ringings can more effectively be cancelled. Further, by making the initial amplitude of the ringing generated with delay small with respect to the initial amplitude of the precedingly-generated ringing, timings at which these two ringings are finally converged can be made to match or come close to each other. Due to this, a phenomenon such as the ringing generated with delay remaining even after the precedingly-generated ringing has been converged can be avoided.

As mentioned above, the phase difference of the two ringings generated by the turn-off of the two low-side switching elements 34a, 34b and their initial phases can suitably be adjusted by suitably determining the resistance values (especially a resistance difference thereof) of the two first gate resistors 38a, 38b. However, optimal adjustments of both the phase difference and the initial amplitudes may be difficult in many cases merely by the resistance values of the first gate resistors 38a, 38b. Due to this, in the power conversion apparatus 10 of the present embodiment, the first delay circuit 48 is provided in the second converter 30b. As mentioned above, the first delay circuit 48 delays the timing at which the low-side gate driver 42b receives the first driving signal X. Then, the low-side gate driver 42b of the second converter 30b turns off the second low-side switching element 34b according to the first driving signal X delayed by the first delay circuit 48. Due to this, the second low-side switching element 34b is turned off with further delay than the first low-side switching element 34a by a delay time caused by the first delay circuit 48.

According to the above configuration, as shown in FIG. 3, the ringing generated by the turn-off of the second low-side switching element 34b takes its maximum value at the timing when the ringing generated by the turn-off of the first low-side switching element 34*a* takes its minimum value, and the amplitudes of the two ringings can be matched at this timing. Specifically, the resistance value of at least one of the first gate resistors 38*a*, 38*b* is adjusted so that the amplitude of one of the ringings when it takes its minimum value and the amplitude of the other of the ringings when it takes its maximum value are matched. Then, the delay time by the first delay circuit 48 is adjusted so that the other ringing takes its maximum value at the same amplitude at the timing when the one ringing takes its minimum value. That is, the delay time by the first delay circuit 48 is adjusted so that the phase difference of the two ringings is set to ½ of the ringing cycle. As a result, the two ringings come to have the same amplitude in reversed phases at all times, and both of them can completely be cancelled out. The first delay circuit 48 may be provided in both the first converter 30*a* and the second converter 30*b* as needed, or may only be provided in the first converter 30*a*.

The resistance values (especially, the resistance difference therebetween) of the two first gate resistors 38*a*, 38*b* are not particularly limited. They may suitably be determined according to the specific configuration of the power conversion apparatus 10 and the ringings that may be generated therein. However, if the resistance difference between the two first gate resistors 38*a*, 38*b* is too large, this would mean that the initial phases of the two ringings would have a great difference, thus a sufficient cancellation of the two ringings may not be facilitated. Thus, the resistance value of the first gate resistor 38*b* of the second converter 30*b* is preferably less than 10 times the resistance value of the first gate resistor 38*a* of the first converter 30*a*. The same applies to the second gate resistors 40*a*, 40*b*, third gate resistors 58*a*, 58*b*, and fourth gate resistors 60*a*, 60*b* to be described later.

Figure 4:
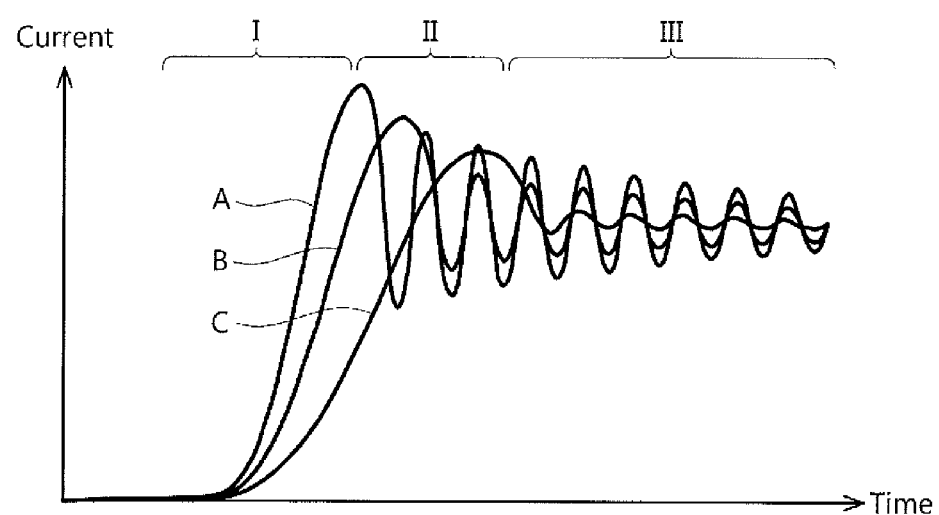
FIG. 4 is a graph showing a current flowing immediately after the low-side switching elements 34a, 34b are turned on, where a curve A shows a case where second gate resistors 40a, 40b have a low resistance, a curve B shows a case where the second gate resistors 40a, 40b have a medium resistance, and a curve C shows a case where the second gate resistors 40a, 40b have a higher resistance.

Next, ringings generated by the turn-on of the low-side switching elements 34*a*, 34*b* will be described. Firstly, the ringing caused by turning on the first low-side switching element 34*a* will be described by taking the first converter 30*a* as an example. As shown in FIG. 4, when the first low-side switching element 34*a* is turned on, the current (drain current) flowing in the first low-side switching element 34*a* rises rapidly towards a target value, and thereafter fluctuates while attenuating toward the target value. That is, a ringing is generated. Since this ringing also can be a cause of the energy losses and electromagnetic noises, thus is desirably reduced.

As shown in FIG. 4, a waveform of the ringing caused by the turn-on of the first low-side switching element 34*a* changes according to a resistance value of the second gate resistor 40*a* used in the turn-on of the first low-side switching element 34*a*. As can be seen in a phase I in FIG. 4, a changing rate of the current flowing in the first low-side switching element 34*a* becomes smaller as the resistance value of the second gate resistor 40*a* becomes higher, as a result of which the switching speed of the first low-side switching element 34*a* is slowed down. As a result, as can be seen in a phase II in FIG. 4, an initial amplitude of the ringing becomes smaller as the resistance value of the second gate resistor 40*a* becomes higher. On the other hand, as can be seen in a phase III in FIG. 4, even if the resistance value of the second gate resistor 40*a* is changed, an attenuation rate and cycles of the ringing do not change. This is because electric properties of a circuit in which the current fluctuates due to the ringing do not change regardless of the resistance value of the second gate resistor 40*a*.

Similarly in the second converter 30*b*, the ringing is generated in a current flowing in the second low-side switching element 34*b* due to the turn-on of the second low-side switching element 34*b*. Further, as shown in FIG. 4, a waveform of the ringing caused by the turn-on of the second low-side switching element 34*b* changes according to a resistance value of the second gate resistor 40*b* used in the turn-on of the second low-side switching element 34*b*.

In regards to the ringings generated by the turn-on of the aforementioned low-side switching elements 34*a*, 34*b*, in the power conversion apparatus 10 of the present embodiment, the second gate resistor 40*b* of the second converter 30*b* has a higher resistance than the second gate resistor 40*a* of the first converter 30*a*. Due to this, the second low-side switching element 34*b* of the second converter 30*b* is turned on with delay with respect to the first low-side switching element 34*a* of the first converter 30*a*.

Figure 5:
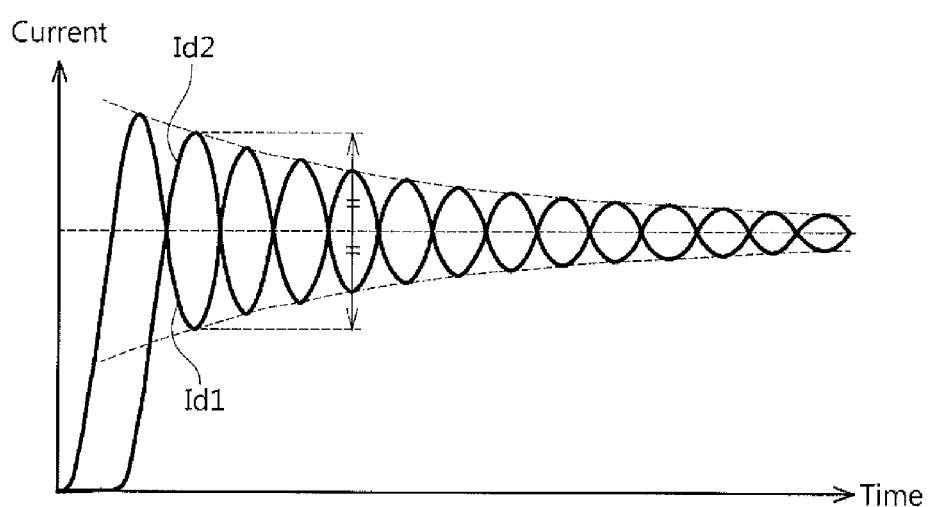
FIG. 5 is a graph showing a current Id1 flowing in the low-side switching element 34a of the first DC-DC converter 30a immediately after its turn-off, and a current Id2 flowing in the low-side switching element 34b of the second DC-DC converter 30b immediately after its turn-on, where a ringing of the current Id1 and a ringing of the current Id2 have a phase difference that is ½ of the ringing cycle, and their envelope curves match each other.

As a result, as shown in FIG. 5, a phase difference is generated between the ringing generated by the turn-on of the first low-side switching element 34*a* and the ringing generated by the turn-on of the second low-side switching element 34*b*. Here, Id1 in FIG. 5 shows the current flowing in the first low-side switching element 34*a*, and Id2 shows the current flowing in the second low-side switching element 34*b*. Due to this, the two ringings generated by the turn-on of two low-side switching elements 34*a*, 34*b* can be partially or completely cancelled according to the phase difference of the two ringings. Similar to the ringings generated by the turn-off as aforementioned, the phase difference of the two ringings can be adjusted according to the resistance values of the two second gate resistors 40*a*, 40*b*.

Moreover, similar to the ringings generated by the turn-off as aforementioned, the initial amplitude of the ringing generated by the turn-on of the second low-side switching element 34*b* becomes smaller than the initial amplitude of the ringing generated by the turn-on of the first low-side switching element 34*a*. That is, the initial amplitude of the ringing generated with delay becomes small with respect to the initial amplitude of the ringing that was precedingly generated. Due to this, the two ringings can more effectively be cancelled by making the amplitudes of the two ringings at a same time point to match or come close to each other. Further, a phenomenon such as the ringing generated with delay remaining even after the precedingly-generated ringing has been converged can be avoided.

Optimal adjustments of both the phase difference and the initial amplitudes of the two ringings generated by the turn-on of the low-side switching elements 34*a*, 34*b* may as well be difficult in many cases merely by the resistance values of the second gate resistors 40*a*, 40*b*. Due to this, in the power conversion apparatus 10 of the present embodiment, the second delay circuit 50 is provided in the second converter 30*b*. As mentioned above, the second delay circuit 50 delays the timing at which the low-side gate driver 42*b* receives the first driving signal X. Then, the low-side gate driver 42*b* of the second converter 30*b* turns on the second low-side switching element 34*b* according to the first driving signal X delayed by the second delay circuit 50. Due to this, the second low-side switching element 34*b* is turned on with further delay than the first low-side switching element 34*a* by a delay time caused by the second delay circuit 50.

According to the above configuration, as shown in FIG. 5, the ringing generated by the turn-on of the second low-side switching element 34*b* takes its maximum value at the timing when the ringing generated by the turn-on of the first low-side switching element 34*a* takes its minimum value, and the amplitudes of the two ringings can be matched at this timing. Specifically, the resistance value of at least one of the second gate resistors 40*a*, 40*b* is adjusted so that the amplitude of one of the ringings when it takes its minimum value and the amplitude of the other of the ringings when it takes its maximum value are matched. Then, the delay time by the second delay circuit 50 is adjusted so that the other ringing takes its maximum value at the same amplitude at the timing when the one ringing takes its minimum value. As a result, the two ringings come to have the same amplitude in reversed phases at all times, and both of them can completely be cancelled out. The second delay circuit 50 may be provided in both the first converter 30a and the second converter 30b as needed, or may only be provided in the first converter 30a.

On the other hand, in the step-down operation of the power conversion apparatus 10, the high-side switching elements 54a, 54b are switched at fast speed, and ringings are generated by the switching of the high-side switching elements 54a, 54b. Similar to the aforementioned low-side switching elements 34a, 34b, when the high-side switching elements 54a, 54b are respectively turned off, the ringings are generated respectively in the voltages between both ends of the high-side switching elements 54a, 54b. A phase difference of these two ringings and initial amplitudes thereof can be adjusted by resistance values of the third gate resistors 58a, 58b and a delay time by the third delay circuit 68. That is, a relationship shown in FIG. 2 can be achieved between the ringings generated by the turn-off of the high-side switching elements 54a, 54b and the third gate resistors 58a, 58b used in the turn-off thereof. Due to this, similar to the aforementioned low-side switching elements 34a, 34b, the two ringings generated by the turn-off of the two high-side switching elements 54a, 54b can effectively or completely be cancelled out.

Further, also when the high-side switching elements 54a, 54b are respectively turned on, ringings are generated in currents flowing in the high-side switching elements 54a, 54b similar to the aforementioned low-side switching elements 34a, 34b. A phase difference of these two ringings and initial amplitudes thereof can be adjusted by resistance values of the fourth gate resistors 60a, 60b used in the turn-on of the high-side switching elements 54a, 54b and a delay time by the fourth delay circuit 70. That is, a relationship shown in FIG. 4 can be achieved between the ringings generated by the turn-on of the high-side switching elements 54a, 54b and the fourth gate resistors 60a, 60b used in the turn-on thereof. Due to this, similar to the aforementioned low-side switching elements 34a, 34b, the two ringings generated by the turn-on of the two high-side switching elements 54a, 54b can effectively or completely be cancelled out.

Figure 6:
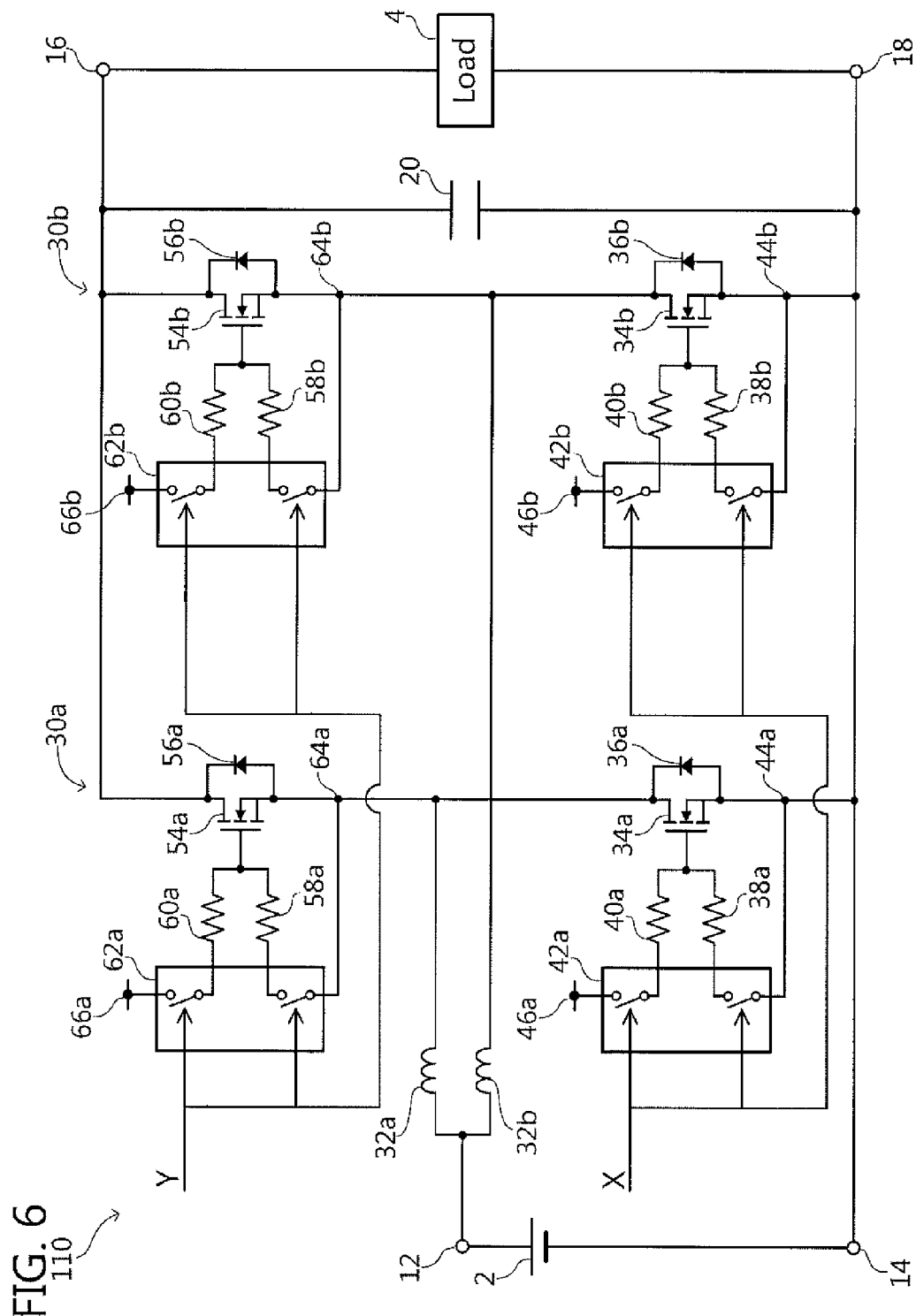
FIG. 6 schematically shows a configuration of a power conversion apparatus 110 of another embodiment.
Figure 7:
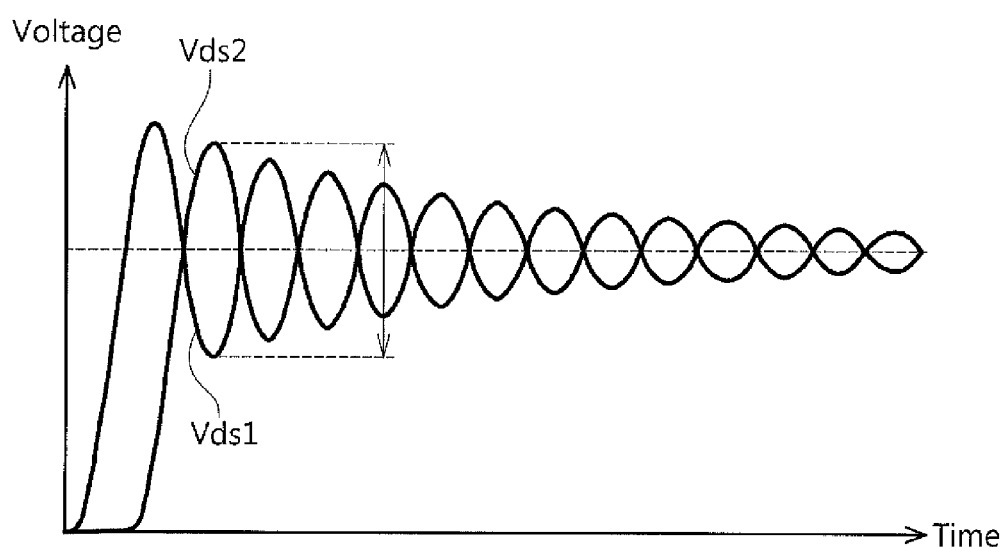
FIG. 7 is a graph exemplifying a voltage Vds1 between both ends of a low-side switching element 34a of a first DC-DC converter 30a immediately after its turn-off and a voltage Vds2 between both ends of a low-side switching element 34b of a second DC-DC converter 30b immediately after its turn-off in the power conversion apparatus 110, where a ringing of the voltage Vds1 and a ringing of the voltage Vds2 have a phase difference that is ½ of the ringing cycle.
Figure 8:
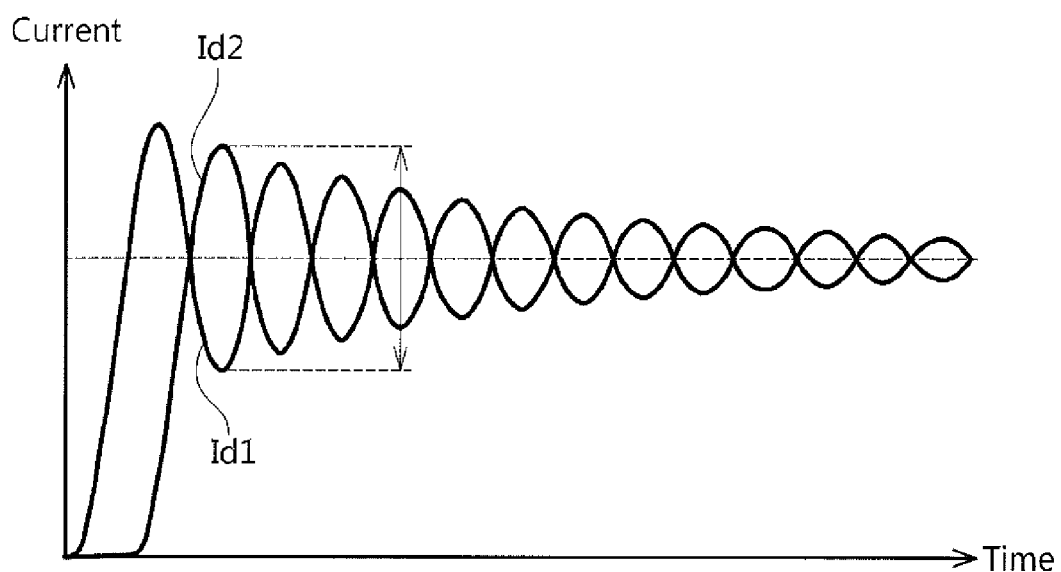
FIG. 8 is a graph showing a current Id1 flowing in the low-side switching element 34a of the first DC-DC converter 30a immediately after its turn-off, and a current Id2 flowing in the low-side switching element 34b of the second DC-DC converter 30b immediately after its turn-on in the power conversion apparatus 110, where a ringing of the current Id1 and a ringing of the current Id2 have a phase difference that is ½ of the ringing cycle.

FIG. 6 shows a power conversion apparatus 110 of another embodiment. As compared to the power conversion apparatus 10 shown in FIG. 1, this power conversion apparatus 110 differs in not being provided with the first delay circuit 48, the second delay circuit 50, the third delay circuit 68, and the fourth delay circuit 70, and is the same thereto regarding other configurations. As in this embodiment, the power conversion apparatus 110 does not necessarily have to be provided with the delay circuits 48, 50, 68, 70. Even in such a configuration, the ringings generated by the turn-off of the low-side switching elements 34a, 34b can be reduced by suitably determining the resistance values of the two first gate resistors 38a, 38b. In this case, for example, as shown in FIG. 7, the resistance values (especially the resistance difference) of the two first gate resistors 38a, 38b are preferably determined so that the phase difference of the two ringings becomes ½ of the ringing cycle. Similarly, the ringings generated by the turn-on of the low-side switching elements 34a, 34b can be reduced by suitably determining the resistance values of the two second gate resistors 40a, 40b. In this case as well, for example, as shown in FIG. 8, the resistance values (especially the resistance difference) of the two first gate resistors 38a, 38b are preferably determined so that the phase difference of the two ringings becomes ½ of the ringing cycle. The same applies to the high-side switching elements 54a, 54b, and the ringings generated by the switching of the high-side switching elements 54a, 54b can effectively be reduced by suitably determining the resistance values of the third gate resistors 58a, 58b and the fourth gate resistors 60a, 60b.

Figure 9:
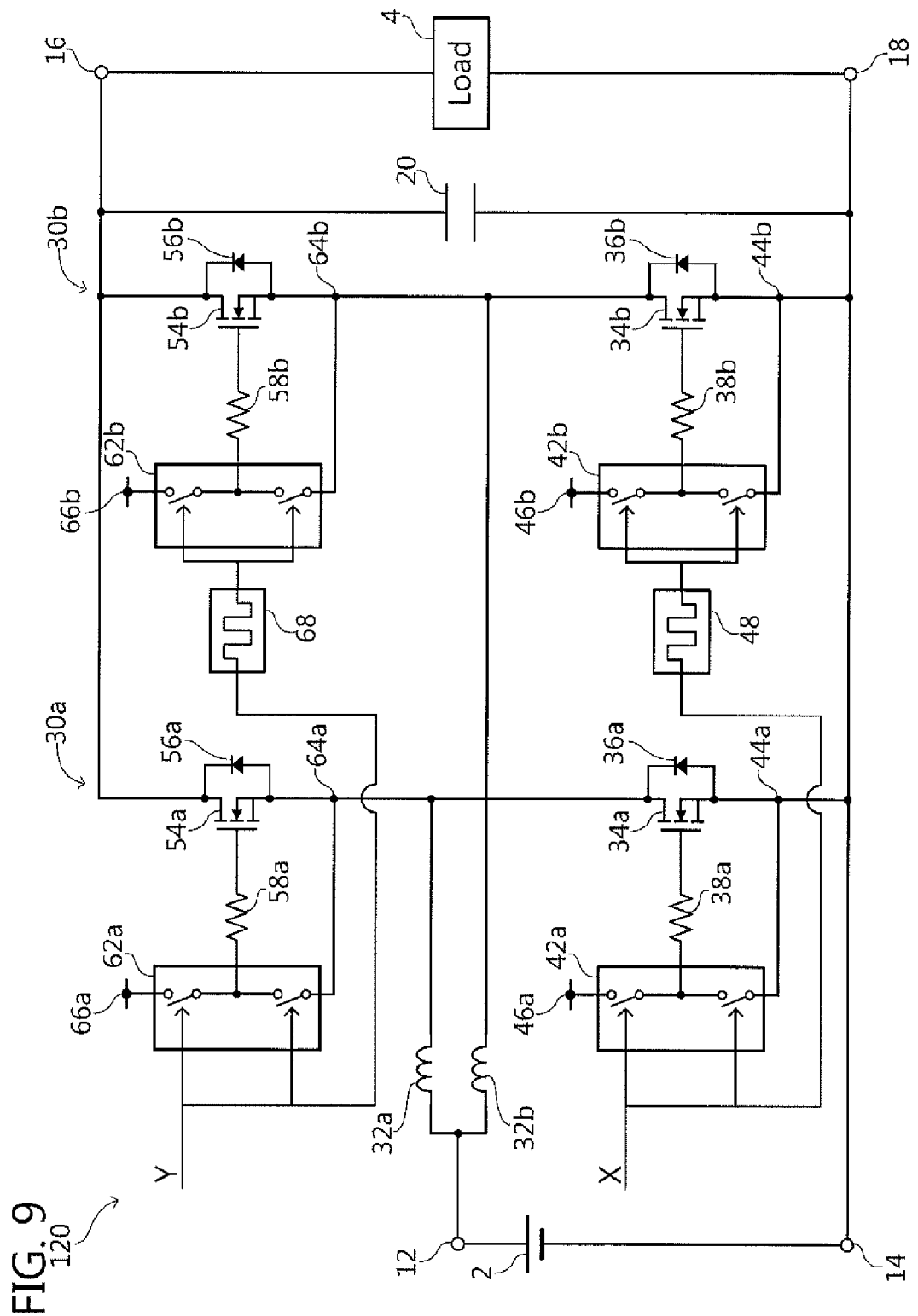
FIG. 9 schematically shows a configuration of a power conversion apparatus 120 of a yet another embodiment.

FIG. 9 shows a power conversion apparatus 120 of yet another embodiment. As compared to the power conversion apparatus 10 shown in FIG. 1, this power conversion apparatus 120 differs in not being provided with the second gate resistors 40a, 40b, the fourth gate resistors 60a, 60b, the second delay circuit 50, and the fourth delay circuit 70. According to this, in the respective converters 30a, 30b, the gate electrodes of the low-side switching elements 34a, 34b are configured to connect with both the off-potential points 44a, 44b and the on-potential points 46a, 46b via the first gate resistors 38a, 38b. Similarly, the gate electrodes of the high-side switching elements 54a, 54b are configured to connect with both the off-potential points 64a, 64b and the on-potential points 66a, 66b via the third gate resistors 58a, 58b. Further, the low-side gate driver 42b of the second converter 30b is changed to turn on and off the low-side switching element 34b according to the first driving signal X delayed by the first delay circuit 48. Similarly, the high-side gate driver 62b of the second converter 30b is changed to turn on and off the high-side switching element 54b according to the second driving signal Y delayed by the third delay circuit 68.

In the power conversion apparatus 120 having the above configuration, for example, the turn-on and turn-off of the high-side switching element 34a of the first converter 30a are performed using the same first gate resistor 38a. Similarly, in the other switching elements 34b, 54a, 54b, both the turn-on and turn-off are respectively performed using the same first gate resistor 38b or the third gate resistors 58a, 58b. Even in such a configuration, the ringings generated by the turn-off and/or turn-on of the respective switching elements 34a, 34b, 54a, 54b can significantly be reduced.

Figure 10:
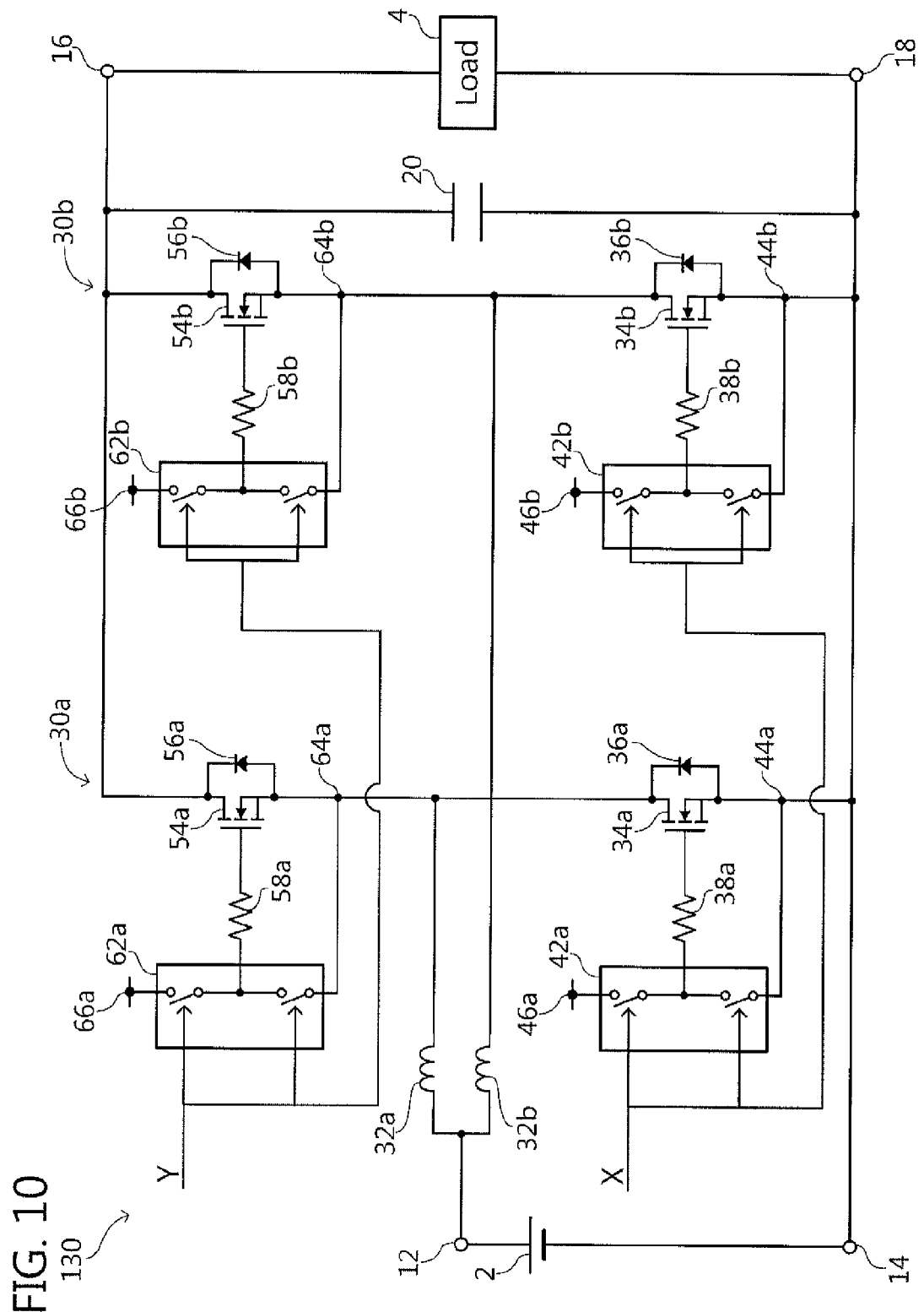
FIG. 10 schematically shows a configuration of a power conversion apparatus 130 of a yet another embodiment.

FIG. 10 shows a power conversion apparatus 130 of yet another embodiment. As compared to the power conversion apparatus 120 shown in FIG. 9, this power conversion apparatus 130 differs in not being provided with the first delay circuit 48 and the third delay circuit 68, and is the same thereto regarding other configurations. As above, the power conversion apparatus 130 does not necessarily have to have the first delay circuit 48, and the ringing generated by the turn-on and/or turn-off of the low-side switching elements 34a, 34b can significantly be reduced by a resistance difference between the two first gate resistors 38a, 38b. Similarly, the power conversion apparatus 130 does not necessarily have to have the third delay circuit 68, and the ringing generated by the turn-on and/or turn-off of the high-side switching elements 54a, 54b can significantly be reduced by a resistance difference between the two third gate resistors 58a, 58b.

Figure 11:
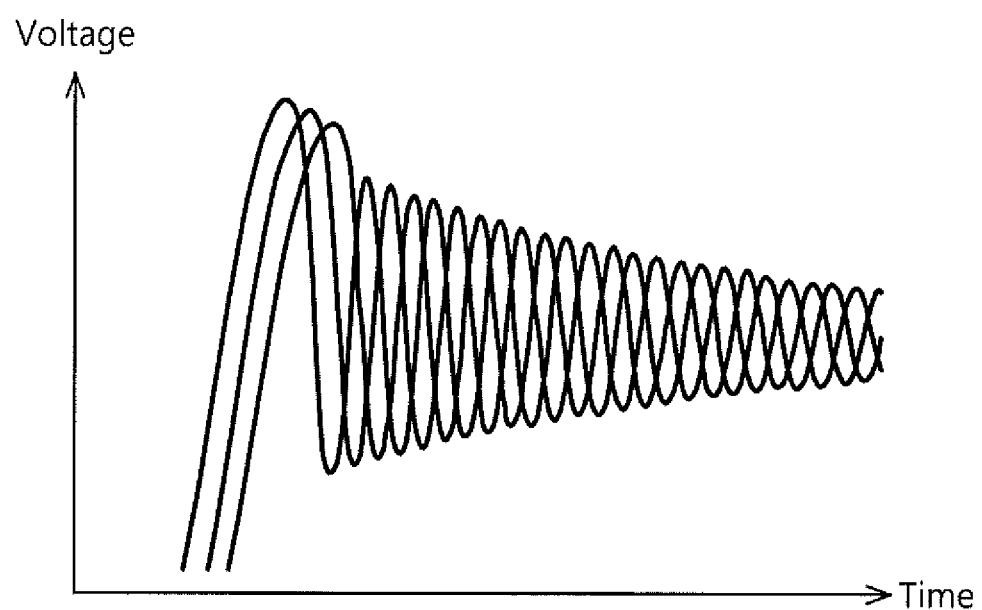
FIG. 11 shows an example of a power conversion apparatus having three or more DC-DC converters, where three ringings caused by turn-off of three switching elements is cancelled out by each other. The three ringings have a phase difference of ⅓ of the ringing cycle.

The aforementioned power conversion apparatuses 10, 110, 120, 130 may be provided with three or more converters. In this case, three or more ringings generated respectively in the three or more converters are given phase differences by making the resistance values of the gate resistors differ among the three or more converters, and the ringings can effectively be reduced. FIG. 11 is an example in which the ringings generated by the turn-off of three low-side switching elements (or high-side switching elements) are reduced. In this example, the three ringings have the phase difference of ⅓ of the ringing cycle relative to each other, and in addition envelope curves of the three ringings match. Furthermore, in a case of reducing n ringings generated by n pieces of switching elements, the gate resistors used in those switching elements may be adjusted so that the n ringings have the phase difference of 1/n of the ringing cycle relative to each other, and the envelope curves of the waveforms of the n ringings match. Alternatively, the n pieces of switching elements may be classified into a plurality of groups, each of which includes two or three switching elements, and the gate resistors of the respective switching elements may be determined so that the two or three ringings are cancelled within each of the groups. In any of these cases, one or a plurality of delay circuits may be used as needed.

Hereinbelow, some of the technical features that are exhibited in this disclosure will be described.

The power conversion apparatus (10, 110, 120, 130) may comprise a positive input port (12) and a negative input port (14) that are configured to be connected with a DC power source (2); a positive output port (16) and a negative output port (18) that are configured to be connected with an electric load (4); a capacitor (20) connected between the positive output port and the negative output port; and a plurality of DC-DC converters (30a, 30b) connected in parallel with each other with respect to the positive input port, the negative input port, the positive output port, and the negative output port. Each of the plurality of DC-DC converters may comprise an inductor (32a, 32b), a high-side diode (56a, 56b), and a low-side switching element (34a, 34b). One end of the inductor may be connected with the positive input port. An anode of the high-side diode may be connected with another end of the inductor and a cathode of the high-side diode may be connected with the positive output port. One end of the low-side switching element may be connected with the other end of the inductor and another end of low-side switching element may be connected with the negative input port and the negative output port. The low-side switching element may be provided with a gate electrode.

Each of the plurality of DC-DC converters may further comprise at least one low-side gate resistor (38a, 38b, 40a, 40b) and a gate driver (42a, 42b). The low-side gate driver may be configured to connect, via the low-side gate resistor, the gate electrode of the low-side switching element selectively with one of an off-potential point (44a, 44b) and an on-potential point (46a, 46b). Here, the low-side switching element turns off by having the gate electrode connected to the off-potential point, and turns on by having the gate electrode connected to the on-potential point. The low-side gate drivers of the plurality of DC-DC converters are each configured to operate in response to a first driving signal. The plurality of DC-DC converters at least includes a first DC-DC converter (30a) and a second DC-DC converter (30b), and the low-side gate resistor (38b, 40b) of the second DC-DC converter may have a higher resistance than the low-side gate resistor (38a, 40a) of the first DC-DC converter. According to this configuration, ringing generated by swinging of the low-side switching element in a boosting operation can effectively be reduced.

The at least one low-side gate resistor (38a, 38b, 40a, 40b) may include a first gate resistor (38a, 38b) and a second gate resistor (40a, 40b) that are connected in parallel with each other with respect to the gate electrode. In this case, preferably the low-side gate driver connects the gate electrode to the off-potential point via the first gate resistor, and connects the gate electrode to the on-potential point via the second gate resistor. According to this configuration, ringing generated by the turn-off of the low-side switching element may effectively be reduced by suitably determining the resistance value (especially the resistance difference) of the first gate resistor. Independent herefrom, as to the ringing generated by the turn-on of the low-side switching element, the ringing may effectively be reduced by suitably determining the resistance value (especially the resistance difference) of the second gate resistor. That is the ringings generated by the turn-on and the turn-off of the low-side switching element can effectively and respectively be reduced.

At least one of the first and second DC-DC converters may further comprise at least one delay circuit (48, 50) configured to delay a timing at which the low-side gate driver receives the first driving signal. According to this configuration, a phase difference of two ringings generated by the two switching elements and initial amplitudes thereof can independently be adjusted by a combination of the resistance value (especially the resistance difference) of the low-side gate resistor of the respective DC-DC converters and the delay time by the delay circuit. Due to this, the two ringings can effectively be cancelled out, and the ringings can be reduced.

At least one delay circuit (48, 50) may include a first delay circuit (48) and a second delay circuit (50) having delay times different from each other. In this case, the low-side gate driver (42b) may connect the gate electrode to the off-potential point (44b) in response to the first driving signal (X) delayed by the first delay circuit (48), and may connect the gate electrode to the on-potential point (46b) in response to the first driving signal (X) delayed by the second delay circuit (50). According to this configuration, a time difference of the turn-off of the two low-side switching elements and a time difference of the turn-on of the two low-side switching elements can be adjusted independently. Due to this, the ringing generated by the turn-off of the switching element and the ringing generated by the turn-on of the switching element can respectively and suitably be reduced.

Each of the plurality of DC-DC converters may further comprise a low-side diode (36a, 36b), a high-side switching element (54a, 54b), a high-side gate resistor (58a, 58b, 60a, 60b), and a high-side gate driver (62a, 62b). A cathode of the low-side diode may be connected with the other end of the inductor (32a, 32b) and an anode of the low-side diode may be connected with the negative input port (14) and the negative output port (18). One end of the high-side switching element (54a, 54b) may be connected with the other end of the inductor (32a, 32b) and another end of high-side switching element (54a, 54b) may be connected with the positive output port (16). The high-side switching element may comprise a high-side gate electrode. The high-side gate driver may be configured to connect, via the high-side gate resistor, the gate electrode of the high-side switching element selectively with one of an off-potential point (64a, 64b) so as to turn-off the high-side switching element and an on-potential point (66a, 66b) so as to turn-on the high-side switching element. The high-side gate drivers of the plurality of DC-DC converters may each be configured to operate in response to a second driving signal. The high-side gate resistor (58b, 60b) of the second DC-DC converter may have a higher resistance than the high-side gate resistor (58a, 60a) of the first DC-DC converter. According to this configura-

What is claimed is:

1. A power conversion apparatus comprising:
a positive input port and a negative input port that are configured to be connected with a DC power source;
a positive output port and a negative output port that are configured to be connected with an electric load;
a capacitor connected between the positive output port and the negative output port; and
a plurality of DC-DC converters connected in parallel with each other with respect to the positive input port, the negative input port, the positive output port, and the negative output port,
wherein each of the plurality of DC-DC converters comprises:
an inductor, one end of the inductor being connected with the positive input port;
a high-side diode having an anode and a cathode, the anode being connected with another end of the inductor and the cathode being connected with the positive output port;
a low-side switching element having a gate electrode, one end of the low-side switching element being connected with the other end of the inductor and another end of low-side switching element being connected with the negative input port and the negative output port;
at least one low-side gate resistor; and
a low-side gate driver configured to connect, via the low-side gate resistor, the gate electrode selectively with one of an off-potential point so as to turn-off the low-side switching element and an on-potential point so as to turn-on the low-side switching element,
the low-side gate drivers of the plurality of DC-DC converters are each configured to operate in response to a first driving signal,
the plurality of DC-DC converters at least includes a first DC-DC converter and a second DC-DC converter,
the low-side gate resistor of the second DC-DC converter has a higher resistance than the low-side gate resistor of the first DC-DC converter,
the at least one low-side gate resistor includes a first low-side gate resistor and a second low-side gate resistor that are connected in parallel with each other with respect to the gate electrode, and
the low-side gate driver is configured to connect the gate electrode with the off-potential point via the first low-side gate resistor and connect the gate electrode with the on-potential point via the second low-side gate resistor.

2. The power conversion apparatus according to claim 1, wherein at least one of the first DC-DC converter and the second DC-DC converter further comprises at least one delay circuit configured to delay a timing at which the low-side gate driver receives the first driving signal.

3. The power conversion apparatus according to claim 2, wherein the at least one delay circuit includes a first delay circuit and a second delay circuit that has a different delay time from that of the first delay circuit, and
the low-side gate driver is configured to connect the gate electrode with the off-potential point in response to the first driving signal delayed by the first delay circuit and connect the gate electrode with the on-potential point in response to the first driving signal delayed by the second delay circuit.

4. The power conversion apparatus according to claim 1, wherein each of the plurality of DC-DC converters comprises:
a low-side diode having a cathode and an anode, the cathode being connected with the other end of the inductor and the anode being connected with the negative input port and the negative output port;
a high-side switching element having a gate electrode, one end of the high-side switching element being connected with the other end of the inductor and another end of high-side switching element being connected with the positive output port;
at least one high-side gate resistor; and
a high-side gate driver configured to connect, via the high-side gate resistor, the gate electrode of the high-side switching element selectively with one of an off-potential point so as to turn-off the high-side switching element and an on-potential point so as to turn-on the high-side switching element,
the high-side gate drivers of the plurality of DC-DC converters are each configured to operate in response to a second driving signal, and
the high-side gate resistor of the second DC-DC converter has a higher resistance than the high-side gate resistor of the first DC-DC converter.

5. A power conversion apparatus comprising:
a positive input port and a negative input port that are configured to be connected with a DC power source;
a positive output port and a negative output port that are configured to be connected with an electric load;
a capacitor connected between the positive output port and the negative output port; and
a plurality of DC-DC converters connected in parallel with each other with respect to the positive input port, the negative input port, the positive output port, and the negative output port,
wherein each of the plurality of DC-DC converters comprises:
an inductor, one end of the inductor being connected with the positive input port;
a high-side diode having an anode and a cathode, the anode being connected with another end of the inductor and the cathode being connected with the positive output port;
a low-side switching element having a gate electrode, one end of the low-side switching element being connected with the other end of the inductor and another end of low-side switching element being connected with the negative input port and the negative output port;
at least one low-side gate resistor; and
a low-side gate driver configured to connect, via the low-side gate resistor, the gate electrode selectively with one of an off-potential point so as to turn-off the low-side switching element and an on-potential point so as to turn-on the low-side switching element,
the low-side gate drivers of the plurality of DC-DC converters are each configured to operate in response to a first driving signal,
the plurality of DC-DC converters at least includes a first DC-DC converter and a second DC-DC converter,
the low-side gate resistor of the second DC-DC converter has a higher resistance than the low-side gate resistor of the first DC-DC converter,
at least one of the first DC-DC converter and the second DC-DC converter further comprises at least one delay circuit configured to delay a timing at which the low-side gate driver receives the first driving signal, the at least one delay circuit includes a first delay circuit and a second delay circuit that has a different delay time from that of the first delay circuit, and the low-side gate driver is configured to connect the gate electrode with the off-potential point in response to the first driving signal delayed by the first delay circuit and connect the gate electrode with the on-potential point in response to the first driving signal delayed by the second delay circuit.

6. The power conversion apparatus according to claim 5, wherein each of the plurality of DC-DC converters comprises:

a low-side diode having a cathode and an anode, the cathode being connected with the other end of the inductor and the anode being connected with the negative input port and the negative output port;

a high-side switching element having a gate electrode, one end of the high-side switching element being connected with the other end of the inductor and another end of high-side switching element being connected with the positive output port;

at least one high-side gate resistor; and a high-side gate driver configured to connect, via the high-side gate resistor, the gate electrode of the high-side switching element selectively with one of an off-potential point so as to turn-off the high-side switching element and an on-potential point so as to turn-on the high-side switching element, the high-side gate drivers of the plurality of DC-DC converters are each configured to operate in response to a second driving signal, and the high-side gate resistor of the second DC-DC converter has a higher resistance than the high-side gate resistor of the first DC-DC converter.

* * * * *